(12) United States Patent
Vuorio et al.

(10) Patent No.: US 11,567,138 B2
(45) Date of Patent: Jan. 31, 2023

(54) METHOD FOR TESTING A CAPACITY OF A DRIVE RESCUE BATTERY OF A TRANSPORTATION SYSTEM, SOFTWARE PROGRAM, AND TESTING ARRANGEMENT

(71) Applicant: Kone Corporation, Helsinki (FI)

(72) Inventors: Teppo Vuorio, Helsinki (FI); Juhamatti Nikander, Helsinki (FI)

(73) Assignee: Kone Corporation, Helsinki (FI)

( * ) Notice: Subject to any disclaimer, the term of this patent is extended or adjusted under 35 U.S.C. 154(b) by 153 days.

(21) Appl. No.: 17/021,394

(22) Filed: Sep. 15, 2020

(65) Prior Publication Data

US 2021/0123976 A1   Apr. 29, 2021

(30) Foreign Application Priority Data

Oct. 23, 2019 (EP) .................................. 19204757

(51) Int. Cl.

| G01R 31/00 | (2006.01) |
|---|---|
| G01R 31/388 | (2019.01) |
| G01R 31/36 | (2020.01) |
| G01R 31/367 | (2019.01) |

(52) U.S. Cl.
CPC ......... G01R 31/388 (2019.01); G01R 31/367 (2019.01); G01R 31/3647 (2019.01)

(58) Field of Classification Search
USPC ......................................... 324/426, 433–435
See application file for complete search history.

(56) References Cited

U.S. PATENT DOCUMENTS 5,949,662 A * 9/1999 Boldin .................... H02J 9/062
                                                               307/66
2018/0057309 A1   3/2018 Nikander et al.

FOREIGN PATENT DOCUMENTS

| CN | 203851060 U | 9/2014 |
| CN | 107677964 A | 2/2018 |
| WO | WO-2019/198234 A1 | 10/2019 |

OTHER PUBLICATIONS

Extended European Search Report for European Application No. 19204757.9 dated May 7, 2020.

* cited by examiner

*Primary Examiner* — Vincent Q Nguyen
(74) *Attorney, Agent, or Firm* — Harness, Dickey & Pierce, P.L.C.

(57) ABSTRACT

A method for testing a capacity of a drive rescue battery includes opening a first switching device and second switching device to disconnect a LCL filter from AC mains and form a test load for testing the capacity of the drive rescue battery while disconnecting one of the LCL filter capacitors associated with a third phase from the test load, the test load including a series connection from one of the downstream LCL filter inductors and the LCL filter capacitors associated with the first phase to one of the LCL filter capacitors and the downstream LCL filter inductors associated with the second phase; and determining at least one of a voltage or a current of the drive rescue battery resulting from the test load.

15 Claims, 4 Drawing Sheets

Figure 1:
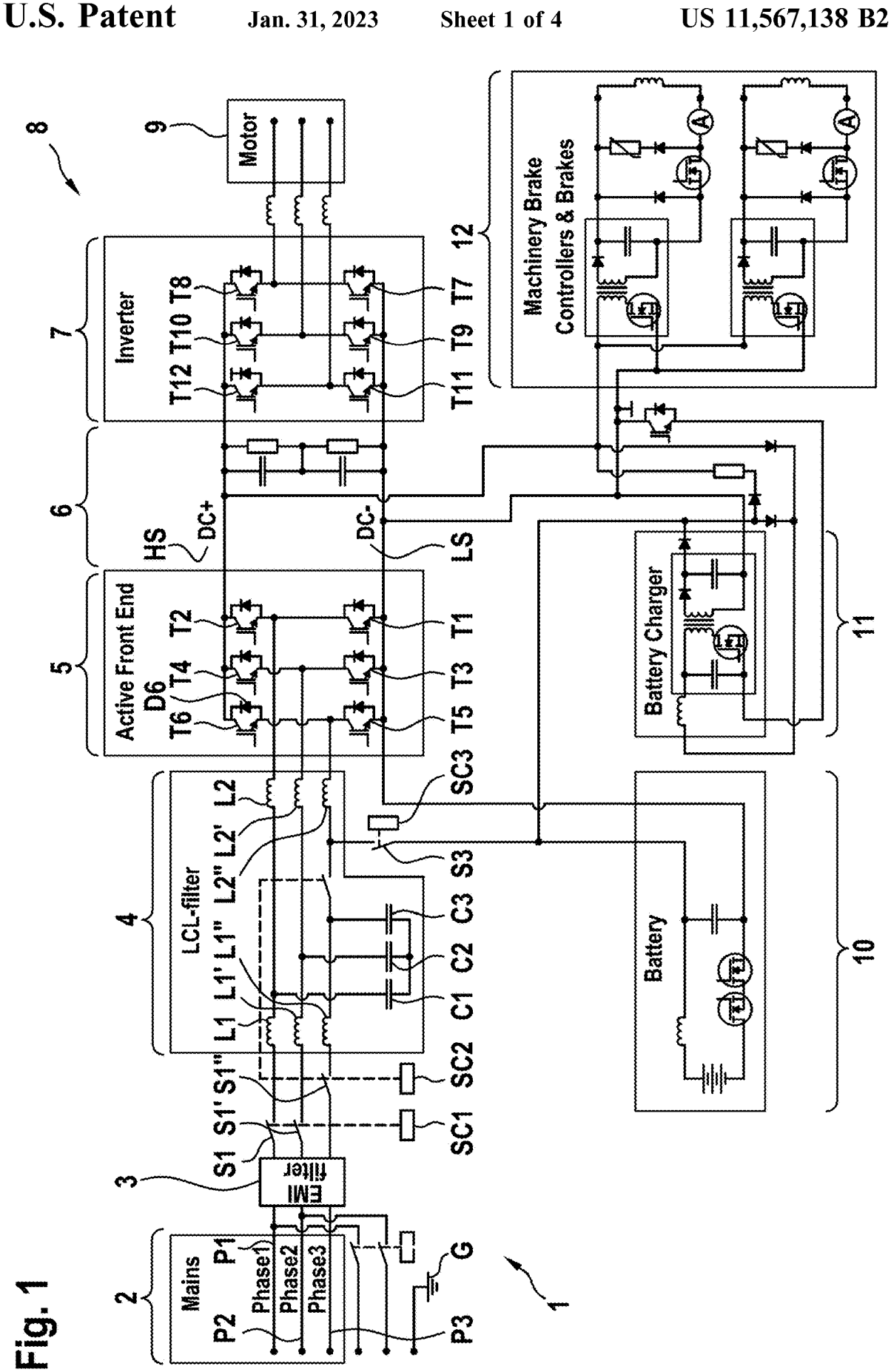

METHOD FOR TESTING A CAPACITY OF A DRIVE RESCUE BATTERY OF A TRANSPORTATION SYSTEM, SOFTWARE PROGRAM, AND TESTING ARRANGEMENT

RELATED APPLICATIONS

This application claims priority to European Patent Application No. 19204757.9 filed on Oct. 23, 2019, the entire contents of which are incorporated herein by reference.

FIELD

The invention relates to method for testing a capacity of a drive rescue battery for driving an electric motor of a transportation system in a rescue operation mode, a software program, and a testing arrangement.

BACKGROUND

When a power sag or power loss occurs, a transportation system such as an elevator, an escalator, a moving walkway or the like my come to an unintended halt concerning a safety of passengers using the transportation system. An elevator may become stalled between floors in the elevator hoistway until the power supply returns to the nominal operating voltage range. In conventional systems, passengers in the elevator may be trapped until a maintenance worker is able to release a brake for controlling cab movement upwardly or downwardly to allow the elevator to move to the closest floor. To improve this situation, elevator systems employing automatic rescue operation have been introduced. These elevator systems include electrical energy storage devices, e.g. in the form of a drive rescue battery, that are controlled after power failure to provide power to move the elevator to the next floor for passenger disembarkation. An integrated rescue feature of new generation drives for elevators thus enables battery discharging to drive internal loads such as moving the trapped elevator car up or down to the closest floor.

However, many current automatic rescue operation systems are complex and expensive to implement, and may provide unreliable power to the elevator drive after a power failure. For example, battery capacity will decrease over time and use. It is extremely important to replace the rescue battery with a new one before a given capacity, i.e. stored electric charge, of the battery is too small to complete the rescue operation leading to a situation that the rescue operation may fail.

Previous attempts to safeguard a sufficient capacity of the drive rescue battery rely on an external load resistor or braking resistor which may have been used as a load resistor. Power from the drive rescue battery can also be supplied to a motor of the elevator but this test operation requires closing of a safety chain of the elevator and having permission from an elevator level controller to perform the test.

SUMMARY

It is therefore an object of the present invention to provide a method for testing a capacity of a drive rescue battery and a testing arrangement for testing the capacity of the drive rescue battery such that it is ensured in a simple, reliable, and energy efficient manner that the rescue battery has always a capacity sufficient for a rescue operation.

The object is solved by the method of claim 1, the computer program product of claim 10, and the testing arrangement of claim 11. Further developments and advantageous embodiments are defined in the dependent claims.

The method according to the invention for testing a capacity of a drive rescue battery for driving an electric motor of a transportation system in a rescue operation mode, wherein in normal operation mode AC means supply power over first, second and third phases via a low pass LCL-filter to a frequency converter for driving the electric motor, wherein the frequency converter comprises a rectifier circuit for providing a DC supply voltage, comprises the steps:
 disconnecting the LCL-filter from the AC mains;
 using inductors and capacitors of the LCL-filter, each of which being connected to the first or second phase, as a test load for testing the capacity of the drive rescue battery, wherein the inductor of the LCL-filter, which is connected to the first phase and downstream of the capacitor of the LCL-filter, which is connected to the first phase, to the rectifier circuit, the capacitors of the LCL-filter connected to the first and second phases, and the inductor of the LCL-filter which is connected to the second phase and downstream of the capacitor of the LCL-filter, which is connected to the second phase, to the rectifier circuit form a series connection as the test load; and
 determining at least one value of a voltage or a current of the drive rescue battery resulting from the test load.

The LCL filter (LCL stands for inductor L-capacitor C-inductor L) is used to reduce higher-order harmonics caused by the switching frequency of electronically switchable switching means of the rectifier circuit, e.g. in the form of insulated gate bipolar transistors (IGBTs). LCL filters in T-form are low pass filters especially designed to reduce harmonics of current absorbed by power converters, with a rectifier input stage such as the rectifier circuit of the frequency converter. Mainly, LCL filters are made of a parallel-series combination of reactors or inductors and capacitors adapted to reduce the Total Harmonic Distortion of the current, abbreviated THD(I), of rectifiers. They are especially designed to reduce the THD(I) to values of approximately 8%, in order to comply with IEC-61000-3.4 and IEEE-519 standards. The LCL-filter may be disconnected from the AC mains downstream of an EMI-filter (EMI is the short form of electromagnetic interference) which is connected to the AC means.

The rectifier circuit may be in the form of an Active Front End (AFE). Rather than using diodes in the rectifier circuit to convert the incoming AC voltage to a DC voltage, in the Active Front End IGBTs are used to convert the incoming AC power to DC. Other electronically switchable switching means than IGBTs may be used. It is possible by means of the AFE to monitor an input current waveform and to shapes it to be sinusoidal, reducing total harmonic distortion (THD) to 5 percent or less, where the THD is only measured for lower-order harmonics. The inventive method may thus executed by means of an Active Front End and the LCL-filter as a test load/power sink for testing that the drive rescue battery has adequate capacity to fulfill a rescue operation.

The first, second, and third phases are defined in the following as the power phases of an AC means supply to supply electric power to a consumer for driving the transportation system, such as a hoisting motor of an elevator. Each phase's voltage, current, and power is offset from the voltage, current, and power of another phase by 120°. Each phase is associated with an electric main, e.g. in form of an electric wire or an electric path of whatever sort, e.g. a conducting layer attached to a substrate like a PCB (printed circuit board), of its own which is conducted from the AC means through the LCL-filter to the rectifier circuit isolated from the electric mains associated with the other phases. Any kind of drive rescue battery suitable for executing a rescue operation in an emergency of the transportation system may be used.

The method enables testing of the capacity of the drive rescue battery by using a main circuit of the drive of the transportation system without having to use external or additional equipment.

With the inductors and capacitors of the LCL-filter, which are connected to the first and second phases anyway, being used as the test load for testing the capacity of the drive rescue battery, a loading resistor is not needed. In addition, battery testing can be done without intervention of a transportation system controller such as an elevator controller. An output inverter connected to the electric motor and/or the electric motor itself are not required for the for testing of the capacity of the drive rescue battery as the test load is provided by the series connection formed by the inductor of the LCL-filter, which is connected to the first phase and downstream of the capacitor of the LCL-filter, which is connected to the first phase, to the rectifier circuit, the capacitors of the LCL-filter connected to the first and second phases, and the inductor of the LCL-filter which is connected to the second phase and downstream of the capacitor of the LCL-filter, which is connected to the second phase, to the rectifier circuit. The drive of the transportation system can perform the battery test whenever the transportation system is not occupied. The capacity of the battery can be tested occasionally, e.g. every month. A controller of the transportation system, e.g. an elevator controller, may be able to detect when there is least traffic and schedule the testing of the capacity of the battery to that time period. For example, the battery test may be performed for about 10 min once a month when there is least traffic, e.g. at night or on a weekend or after business hours.

The method of testing the capacity of the battery may be performed to a fully charged battery. During the test, the battery can be discharged with a constant electric power of e.g. 200 W. The duration of the test can be made specific to the type of transportation system, e.g. 10 minutes for a specific type of elevator. During the test, a voltage of the battery can be measured, wherein the voltage may decrease proportional to the condition of the battery. A simple and reliable method that the rescue battery has always a capacity sufficient for a rescue operation is thus provided. At the same time, the inventive method is energy efficient for the electric motor not being required to move to represent the test load.

The method is preferably executed by further comprising:
  modulating, e.g. by pulse width modulation (PWM), electronically switchable switching means of the rectifier circuit which are connected to the first and second phases to generate an AC-voltage from the DC supply voltage supplied by the drive rescue battery, which AC-voltage is applied to the test load.

The electronically switchable switching means of the rectifier circuit may be insulated gate bipolar transistors. Gates of the electronically switchable switching means may be modulated to generate the AC-voltage from the DC supply voltage supplied by the drive rescue battery.

In a further embodiment, the modulating of the first and second phases of the rectifier circuit comprises the steps:
  operating the high side electronically switchable switching means of the rectifier circuit connected to the first phase and the low side electronically switchable switching means of the rectifier circuit connected to the second phase to be closed while operating the other electronically switchable switching means of the rectifier circuit connected to the first and second phases to be open, and
  operating the high side electronically switchable switching means of the rectifier circuit connected to the second phase and the low side electronically switchable switching means of the rectifier circuit connected to the first phase to be closed while operating the other electronically switchable switching means of the rectifier circuit connected to the first and second phases to be open.

Both steps may occur subsequently to each other, wherein the second step can be executed before or after the first step. Intermediate steps are possible as long both steps are executed during testing of the capacity of the drive rescue battery. The first step leads to a current running from a high side of the DC supply voltage to a low side thereof. The second first step leads to a current running in the opposite direction of the first step, i.e. from the low side of the DC supply voltage to the high side thereof.

The electronically switchable switching means of the rectifier circuit connected to the first and second phases are preferably modulated such that a fundamental frequency and a voltage level of the AC-voltage over the capacitors of the LCL-filter connected to the first and second phases are controlled to provide a constant discharge power as a reference value, e.g. 200 W, to the drive rescue battery, wherein a discharge value is determined for comparison with the reference value by measuring a voltage and a current of the drive rescue battery. The first and second phases of the LCL-filter are modulated with AC-voltage by modulating the electronically switchable switching means of the rectifier circuit, which fundamental frequency and voltage level over the LCL-filter capacitors can be controlled to keep constant discharge power. A discharge power of approximately 230 V, approximately 10 A at a frequency of approximately 1000 Hz may be provided over the LCL-filter capacitors connected to the first and second phases.

It is preferred that, when the series connection is used as the test load for testing the capacity of the drive rescue battery, the electric motor is at rest. The motor is thus not running during the test of the capacity of the battery. This way, an energy efficient testing of the battery becomes possible.

In an advantageous embodiment of the invention, the inventive method further comprises the following steps after disconnecting the LCL-filter from the AC mains and prior to using the inductors and capacitors of the LCL-filter, each of which being connected to the first or second phase, as the test load:
  disconnecting an inductor of the LCL-filter connected to the third phase, which inductor is connected downstream of a capacitor of the LCL-filter connected to the third phase, to the third phase of the rectifier circuit, upstream of the inductor from the rest of the LCL-filter; and
  connecting one terminal of the drive rescue battery to the inductor of the LCL-filter connected to the third phase such that the inductor forms a boost converter storage choke in the rescue operation mode.

When a battery test is requested, a drive main circuit including the LCL-filter and the rectifier circuit of the frequency converter is isolated from the AC mains power supply to be able to use LCL-filter and the rectifier circuit, e.g. in the form of the Active Front End for loading the drive rescue battery. A battery negative terminal may be connected to a low side of the DC supply voltage, which may be labeled DC-link minus potential. A battery positive terminal may be connected to the inductor of the LCL-filter connected to the third phase, which inductor acts as boost converter storage choke. A boost converter may be formed by the low side electronically switchable switching means of the rectifier circuit connected to the third phase as switch and a diode switched in parallel to a high side electronically switchable switching means of the rectifier circuit connected to the third phase, as a boost rectifier.

It is thus preferred that the boost converter is formed by the low side electronically switchable switching means of the rectifier circuit connected to the third phase as a boost converter switch, the diode, which is switched in parallel to the high side electronically switchable switching means of the rectifier circuit connected to the third phase, as a boost rectifier, and a capacitive intermediate device of the frequency converter for leveling the DC supply voltage as a boost converter capacitor. The high side and low side electronically switchable switching means of the rectifier circuit may be IGBTs.

As stated above, it is preferred that the negative terminal of the drive rescue battery is connected to the DC-link minus potential of the DC supply voltage and the positive terminal of the drive rescue battery is connected to the inductor of the LCL-filter connected to the third phase. Alternatively, the positive terminal of the drive rescue battery may be connected to a DC-link plus potential of the DC supply voltage and the negative terminal of the drive rescue battery may be connected to the inductor of the LCL-filter connected to the third phase.

It is particularly preferred that a local drive unit of the frequency converter and/or an external server initiate(s) and/or execute(s) the testing of the capacity of the drive rescue battery and/or analyse(s) results of the testing of the capacity of the drive rescue battery, e.g. at least one value of at least one measurement of the voltage, the current, a voltage decrease over time, e.g. 10 minutes, and/or a current decrease over time of the drive rescue battery to determine an energy/charge level of the drive rescue battery for comparison with a required energy/charge level which is indicated by a threshold or several thresholds which are different from each other for weighing different urgencies for maintenance of the drive rescue battery.

The condition of the battery may thus be determined locally, e.g. in the elevator system, and/or externally on a cloud server by testing of the capacity thereof. If the condition decreases under the threshold, the maintenance need can be indicated/informed to a maintenance unit, service unit, and/or maintenance person, e.g. in the field, so that maintenance actions may be scheduled and performed accordingly. There may be several thresholds for weighting the urgency for maintenance of the drive rescue battery. For instance, a first threshold results in an information/alert that maintenance is needed for the drive rescue battery in the next maintenance appointment as scheduled. A second threshold of lower capacity of the battery as indicated by the first threshold may indicate a need for immediate maintenance. A third threshold of yet lower capacity of the battery as indicated by the second threshold may indicate a need of taking the transportation system out of service in a controlled manner, e.g. by moving an elevator car to a next floor for disembarkation of the passengers, until the battery has been replaced.

After the testing of the capacity of the drive rescue battery, the measurements of voltage, current, voltage decrease over time and/or a current decrease over time may be sent to a cloud server for analysis. A required energy/charge level of the battery to perform a worst case scenario rescue operation of the transportation system, e.g. elevator system, may be determined and/or stored in/on the cloud. Based on the received battery test voltage and/or current measurements, the cloud server may calculate the energy/charge level of the drive rescue battery and compare it to the required energy/charge level for a worst case scenario of rescue operation. The cloud server indicates the maintenance/replacement need for the battery in good time before the battery fails to perform the required worst case scenario of rescue operation, e.g. according to the different threshold levels discussed above. Also, the analysis of the results of the testing of the capacity of the drive rescue drive could be done alternatively to an external server such as a cloud server or in work sharing with such a server locally in a battery management system that would have a required energy/charge level of the battery to perform the worst case scenario rescue operation of the transportation system, e.g. elevator system, stored in its memory. Then, the battery management system may send the maintenance need information to the cloud server, the service unit, and/or the maintenance person.

Another aspect of the invention is a software program realizing the methods according to the invention when executed on a computer. In the aforementioned software program the computer is preferably a distributed computing system wherein part of the computing system is located/arranged/operated in a cloud computing system. The software program may be embodied as a computer program product or a data carrier carrying data representing the software program.

The invention also relates to a testing arrangement for testing a capacity of a drive rescue battery configured to drive an electric motor of a transportation system in a rescue operation mode. The testing arrangement comprises the drive rescue battery and measuring means configured to measure a voltage, a current, a voltage decrease over time, e. g. 10 minutes, and/or a current decrease over time of the drive rescue battery, first, second, and third phases of AC-means which are configured to supply power from the AC-means via a low pass LCL-filter to a frequency converter configured to drive the electric motor in normal operation mode, the LCL-filter, a rectifier circuit of the frequency converter configured to provide a DC supply voltage, a first switching device configured to disconnect the AC means from the LCL-filter, a second switching device configured to disconnect an inductor of the LCL-filter connected to the third phase, wherein the inductor is connected downstream of a capacitor of the LCL-filter connected to the third phase, upstream of the inductor from the rest of the LCL-filter, and a local drive unit of the frequency converter and/or an external server configured to initiate and/or execute the testing of the capacity of the drive rescue battery, wherein, if the first and second switching devices are opened, inductors and capacitors of the LCL-filter, wherein each of which is connected to the first or second phase, form a test load for testing the capacity of the drive rescue battery, wherein the inductor of the LCL-filter, which is connected to the first phase and downstream of the capacitor of the LCL-filter connected to the first phase to the rectifier circuit, the capacitors of the LCL-filter connected to the first and second phases, and the inductor of the LCL-filter which is connected to the second phase downstream of the capacitor of the LCL-filter connected to the second phase to the rectifier circuit form a series connection as the test load. The advantages mentioned in connection with the inventive method of testing of the capacity of the drive rescue apply correspondingly for the inventive testing arrangement. Each of the first and second switching devices may comprise one or several switches controlled by one switching control unit. Therefore, several phases may by switched, e.g. together and simultaneously, by one switching device.

In a further embodiment, of the testing arrangement, the inductor of the LCL-filter connected to the first phase is connected to a link connecting a low side electronically switchable switching means and a high side electronically switchable switching means of the rectifier circuit connected to the first phase and the inductor of the LCL-filter connected to the second phase is connected to a link connecting a low side electronically switchable switching means and a high side electronically switchable switching means of the rectifier circuit connected to the second phase. Each of the links may be associated with an electric main, e.g. in form of an electric wire or an electric path of whatever sort, e.g. a conducting layer attached to a substrate like a PCB.

Advantageously, the testing arrangement comprises a third switching device configured to disconnect one terminal of the drive rescue battery from the inductor of the LCL-filter connected to the third phase upstream of the inductor, wherein, if the first and second switching means are opened and the third switching device is closed, the inductor of the LCL-filter connected to the third phase forms a boost converter storage choke in the rescue operation mode. This way, the battery is able to supply electric power/charge to the capacitive intermediate device of the frequency converter for leveling the DC supply voltage, i.e. the DC-link, directly or via one or several converters which is able to further supply electric power/charge to the rectifier circuit, e.g. the AFE, and the LCL-filter. As explained above for the first and second switching devices, several phases may by switched, e.g. together and simultaneously, by the third switching device.

In a preferred embodiment, the inductor of the LCL-filter connected to the third phase is connected to a link connecting a low side electronically switchable switching means and a high side electronically switchable switching means of the rectifier circuit connected to the third phase such that the inductor such that the inductor forms a boost converter storage choke in the rescue operation mode. The boost converter may then be formed by the low side electronically switchable switching means of the rectifier circuit connected to the third phase as a boost converter switch, the diode switched in parallel to the high side electronically switchable switching means of the rectifier circuit connected to the third phase, as a boost rectifier, and the capacitive intermediate device of the frequency converter for leveling the DC supply voltage as a boost converter capacitor.

Further embodiments of the inventive method, the inventive software program, and the testing arrangement according to the invention include that
the transportation system is formed by one of an elevator, escalator and a moving sidewalk and/or
the rectifier circuit is formed by an Active Front End (AFE) and/or
at least one the high side and low side electronically switchable switching means of the rectifier circuit connected to the first, second, and third phases are formed by an Insulated Gate Bipolar Transistor. The transportation system is thus selected with advantage from one of an elevator, an escalator, and a moving walkway. It is further possible to select the transportation system from one of a cablecar, a railway locomotive, a railcar, a roller coaster, a conveyor, a crane, a positioning unit, and combined systems of a plurality of single units of the same. It is particularly preferred that an elevator or escalator serves as the transportation system. Most preferably, the transportation system is an elevator. Instead of a IGBT for the electronically switchable switching means of the rectifier circuit, a MOSFET (Metal Oxide Semiconductor Field Effect Transistor), SiC (Silicon Carbide) MOSFET or any other high power semiconductor switching means may be used.

DRAWINGS

Other aspects, features and advantages of the invention will become apparent by the below description of exemplary embodiments alone or in cooperation with the appended drawings.

Figure 2:
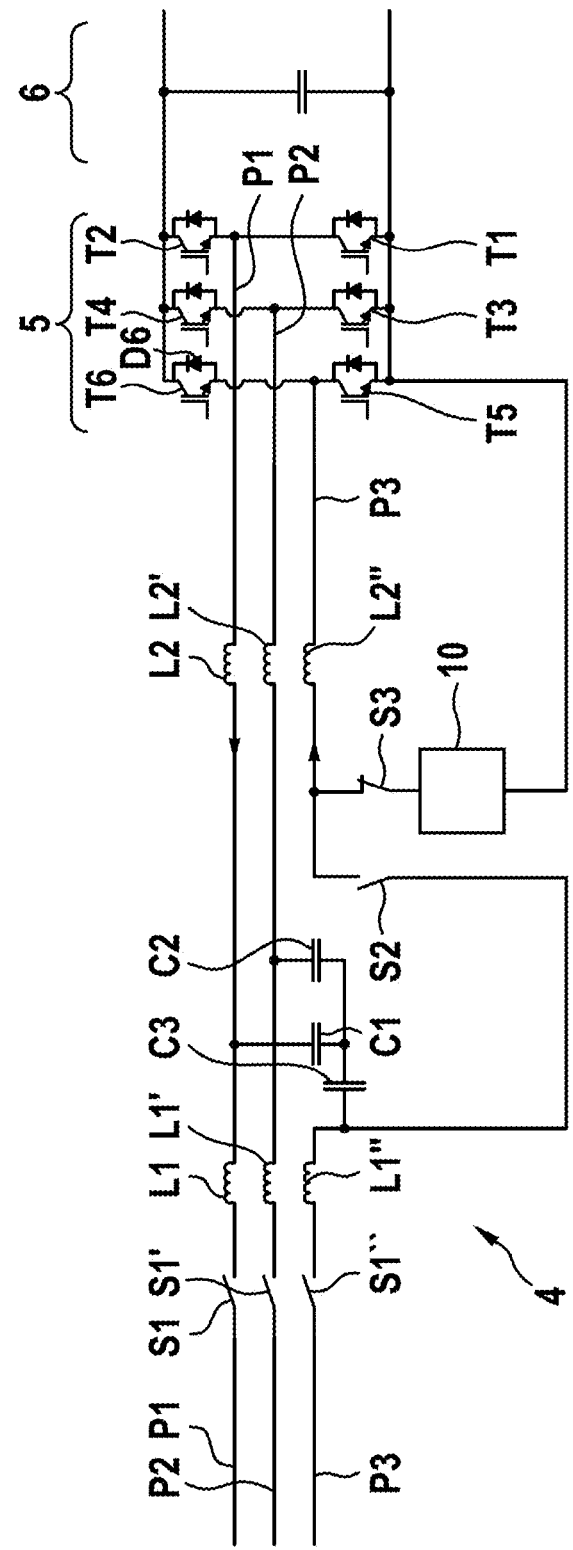
Figure 3:
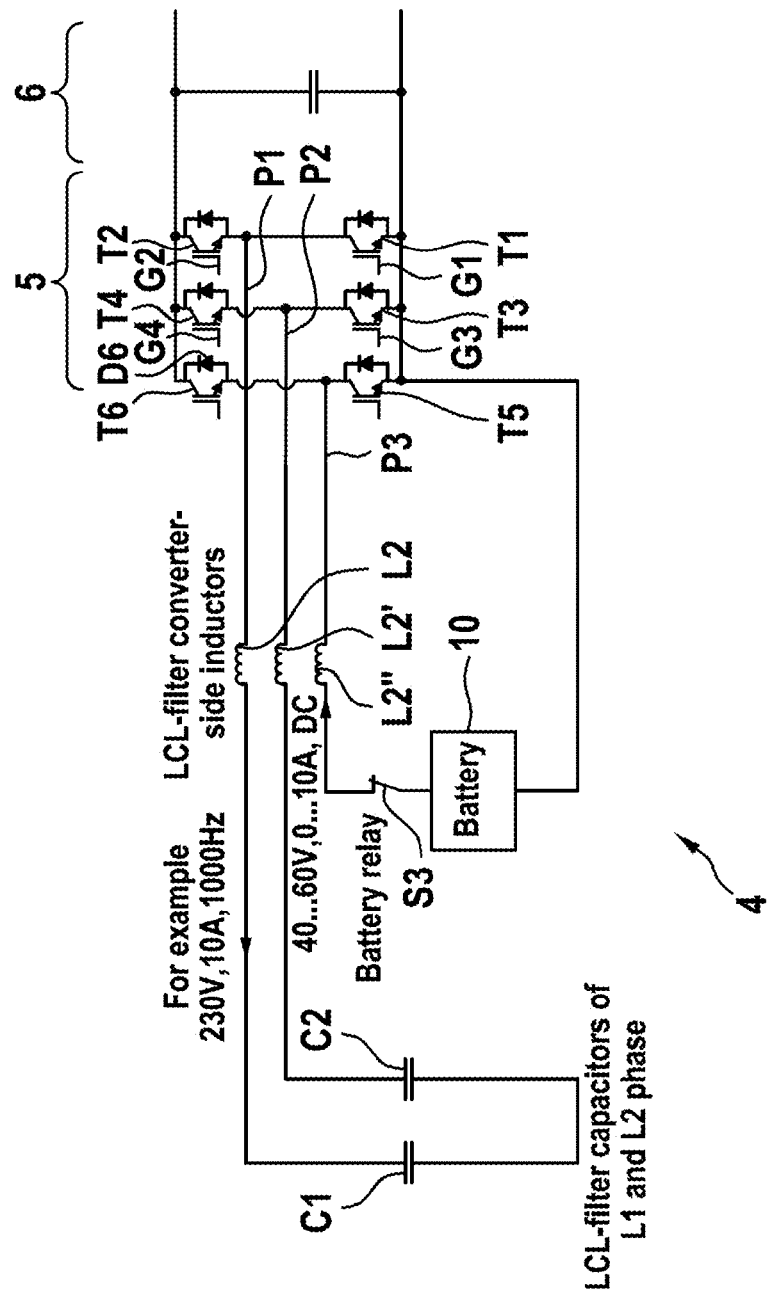
Figure 4:
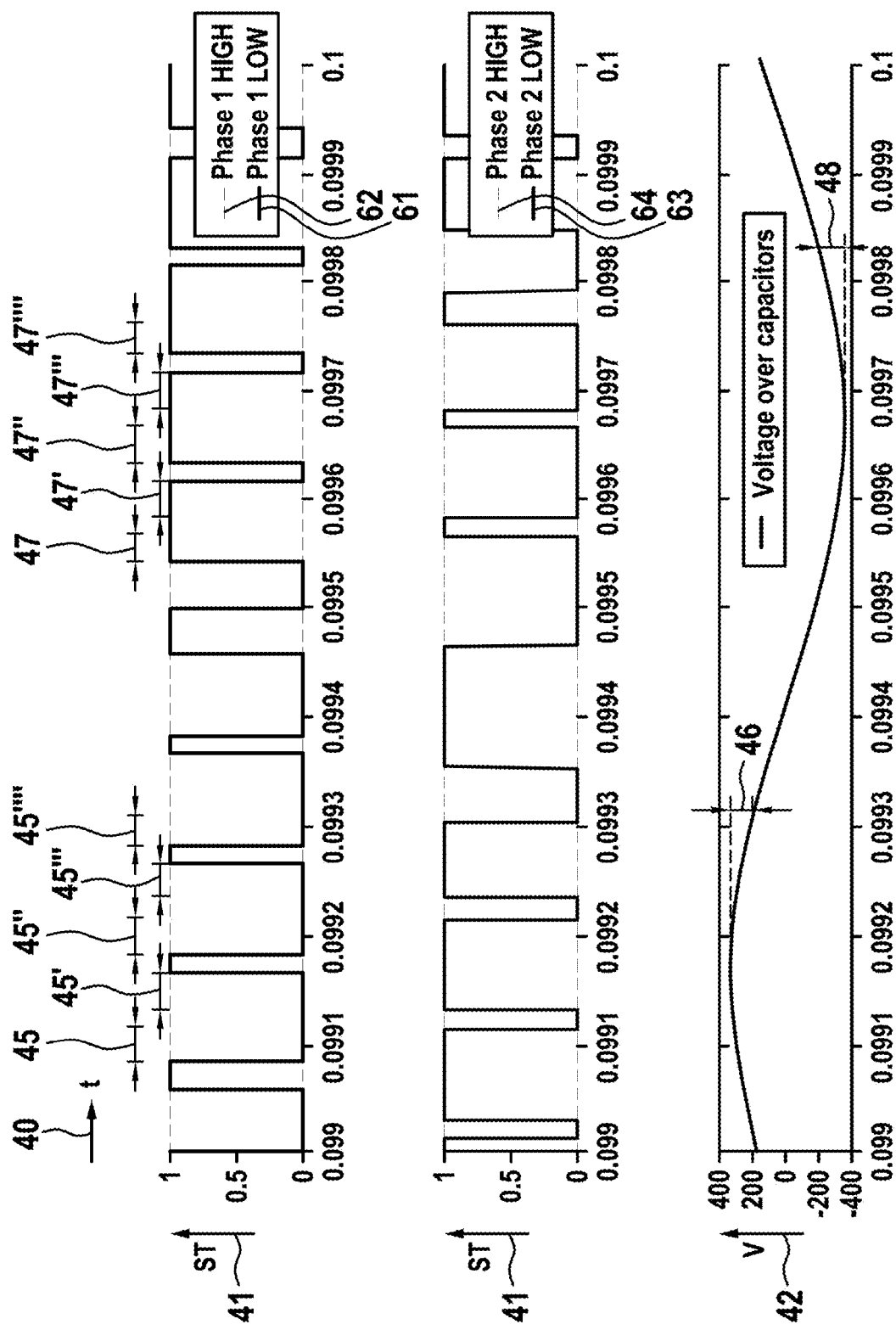

FIG. 1 is an electric diagram of the motor and brake drive section of an elevator system including a drive rescue battery and a battery charger according to an exemplary embodiment of the invention, FIG. 2 is an electric diagram of a testing arrangement for testing a capacity of the drive rescue battery, which is shown as an excerpt of FIG. 1, FIG. 3 is a simplified electric diagram of the testing arrangement of FIG. 2 for driving the electric motor of the elevator system in a rescue operation mode according to the invention, and FIG. 4 is a set of three timing charts over 1 ms according to another exemplary embodiment of the invention, wherein the upper chart shows pulse width modulation sequences of gates of two IGBTs of a rectifier circuit connected to one phase, the medium chart shows pulse width modulation sequences of gates of two other IGBTs of the rectifier circuit connected to another phase, and the lower chart shows the resulting AC-voltage generated by the pulse width modulation sequences of the gates of the IGBTs over two inductors and two capacitors of an LCL-filter as a test load of the drive rescue battery.

DETAILED DESCRIPTION

Now, exemplary embodiments of the invention will be described in further detail.

FIG. 1 shows an electric diagram of the motor and brake drive section of an elevator system including a drive rescue battery 10 and a battery charger 11 for the drive rescue battery 10. The motor and brake drive section is supplied with electric AC power in normal operation mode by AC means 2 which supply power over a first phase P1, a second phase P2 and a third phase P3 via a low pass LCL-filter 4 to a frequency converter 8 for driving an electric motor 9 for moving an elevator car of the elevator system. The phases P1, P2, P3 provide AC-voltage offset by approximately 120 degrees to each other with respect to ground G. An EMI filter may be inserted between the AC means 2 and the LCL-filter 4 as shown in the figure. The frequency converter 8 comprises a rectifier circuit 5 for providing a DC supply voltage, a capacitive intermediate device 6 for leveling the DC supply voltage, and an output inverter 7 for generating the AC power supplied to the electric motor 9 as required to control a movement of the elevator car of the elevator system. The rectifier circuit 5 is in the form of an Active Front End comprising electronically switchable switching means T1 to T6 with diodes, e.g. diode D6 of IGBT of T6, switched in parallel thereto functioning as freewheeling diodes. The electronically switchable switching means T1 to T6 are embodied as IGBTs with the IGBTs T1, T3, and T5 at a low side LS of the DC supply voltage, which may be labeled DC-link minus potential, and the IGBTs T2, T4, and T6 at a high side HS of the DC supply voltage. IGBTs T1, T2 are linked to each other and connected to the first phase P1, IGBTs T3, T4 are linked to each other and connected to the second phase P2, and IGBTs T5, T6 are linked to each other and connected to the third phase P3. A corresponding arrangement of electronically switchable switching means as that of the rectifier circuit 5 in the form of IGBTs T7 to 112 is set up in the output inverter 7 for generating the AC-voltage for the motor 9.

The battery charger 11 is not only connected to the DC plus terminal of the drive rescue battery but also to the high side HS and low side LS of the DC supply voltage. The battery charger can therefore also supply DC-voltage to the capacitive intermediate device 6 and to redundant machinery brake controllers and thus brakes of the machinery brake controllers and brakes 12. Moreover, the capacitive intermediate device 6 of the frequency converter 8 can be used to charge the battery charger 11 in a regenerative manner of the frequency converter 8. The battery 10 is, in the design shown in FIG. 1 connected between the DC-link minus potential and the third phase P3. The battery charger 11 comprises a transformer which is used to lower the DC-link voltage of the capacitive intermediate device 6, also called DC-link, to become suitable for the battery 10 and is connected between the DC-link plus potential and the DC plus terminal of the battery 10. Battery charger 11 may comprise one or several switches enabling the control of the charging. In FIG. 1, such a switch is shown as a transistor at the bottom of the left side of the transformer. Also, the battery 10 may comprise switches enabling the control of power supply with the battery and shown in FIG. 1 as two transistors next to each other. The redundant machinery (motor) brake controllers are connected to the DC-link via transformers and supply independently the redundant hoisting machinery (motor) brakes.

The testing arrangement 1 for testing a capacity of the drive rescue battery 10 according to the invention comprises the drive rescue battery 10, the first phase P1, the second phase P2 and the third phase P3 of the AC means 2 which are configured to supply power from the AC-means 2 via the low pass LCL-filter 4 to the frequency converter 8 for driving the electric motor 9 in normal operation mode, the LCL-filter 4, the rectifier circuit 5 of the frequency converter 8, a first switching device comprising switches S1, S1', S1" for disconnecting the AC means 2 from the LCL-filter 4, and a second switching device comprising the switch S2 for disconnecting an inductor L2" of the LCL-filter 4 connected to the third phase P3 upstream of the inductor L2" from the rest of the LCL-filter 4. The inductor L2" is connected downstream of a capacitor C3 of the LCL-filter 4, which capacitor C3 is connected to the third phase P3.

The switch S1 is configured to disconnect the LCL-filter 4 from the AC-means 2 downstream of the EMI-filter 3 and connected to the first phase P1. The switch S1' is configured to disconnect the LCL-filter 4 from the AC-means 2 downstream of the EMI-filter 3 and connected to the second phase P2. Switches S1 and S1' are controlled by switch control unit SC1. The switch S1" is configured to disconnect the LCL-filter 4 from the AC-means 2 downstream of the EMI-filter 3 and is connected to the third phase P3. Switches S1" and S2 are controlled by switch control unit SC2. If the first switches S1, S1', S1" and the second switch S2 are opened, inductors L2, L2' and capacitors C1, C2 of the LCL-filter 4, wherein L2 and C1 are connected to the first phase P1 and L2 # and C2 are connected to the second phase P2, form a test load for testing the capacity of the drive rescue battery 10. Inductor L1 of the LCL-filter 4, which is connected to the first phase P1 upstream of the capacitor C1, and inductor L1 of the LCL-filter 4, which is connected to the second phase P2 upstream of the capacitor C2, are not part of a closed electric circuit and thus not operating. In contrast to L1 and L1, inductors L2 and L2' are connected via capacitors C1 and C2 in a series connection to the rectifier circuit connected to the first phase Pa1 and the second phase P2 to be supplied with AC-voltage by modulating the gates of the IGBTs T1 to T4 for constituting the test load of the drive rescue battery 10. To this end, inductor L2 of the LCL-filter 4, which is connected to the first phase P1 and downstream of the capacitor C1 of the LCL-filter 4 connected to the first phase P1 to the rectifier circuit 5, the capacitors C1, C2 of the LCL-filter 4 connected to the first phase P1 and the second phase P2, and the inductor L2' of the LCL-filter 4 which is connected to the second phase P2 and downstream of the capacitor C2 of the LCL-filter 4, which is connected to the second phase P2, to the rectifier circuit 5 form the series connection as the test load for the battery 10.

A third switch S3 is configured to disconnect a DC plus terminal of the drive rescue battery 10 from the inductor L2" of the LCL-filter 4 connected to the third phase P3 upstream of the inductor L2", wherein, if the first switches S1, S1', S1" and the second switch S2 are opened and the third switch S3 is closed, the inductor L2" of the LCL-filter 4 connected to the third phase P3 forms a boost converter storage choke in the rescue operation mode and in the inventive method for testing the capacity of the battery 10. The switch S3 is controlled by switch control unit SC3. When the switch S1" and S2 are opened by switch control unit SC2, inductor L1" of the LCL-filter 4, which is connected to the third phase P3 upstream of the capacitor C3, and capacitor C3 of the LCL-filter 4, which is connected to the third phase P3 upstream of the inductor L2", are not part of a closed electric circuit and thus not operating. When first switches S1, S1', S1" and second switch S2 are opened and the third switch S3 is closed, a boost converter is formed by the inductor L2" of the LCL-filter 4 connected to the third phase P3 forming the boost converter storage choke,
the low side IGBT T5 of the rectifier circuit 5 connected to the third phase P3 as a boost converter switch,
the diode D6 switched in parallel to high side IGBT T6 of the rectifier circuit 5 connected to the third phase P3 as a boost rectifier, and
the capacitive intermediate device 6 of the frequency converter 8, especially the capacitors thereof connected in series, for leveling the DC supply voltage as a boost converter capacitor.

FIG. 2 as an excerpt of FIG. 1 is an electric diagram of the testing arrangement 1 for testing a capacity of the drive rescue battery 10. During the test of the capacity of the drive rescue battery 10, the battery may be used in boost operation as indicated in the figure. When the battery is tested for its capacity, the switches S1, S1', S1" arranged between the EMI-filter 3 (see FIG. 1) and the LCL-filter 4 are opened to disconnect the AC-mains 2 from the test circuit. Switch S2 connected to the third phase P3 and shown in FIG. 1 within a boundary of the LCL-filter 4 is opened to disconnect the inductor L1" and the capacitor C3 from the second inductor L2) of the LCL-filter. Then, the switch S3 arranged between the LCL-filter 4 and the battery 10 is closed to connect the battery 10 to the AFE forming the rectifier circuit 5. Now, the lower side IGBT T5 connected between the third phase P3 and the low side LS of the DC supply voltage, also called DC-link minus potential or DC minus, and the high side parallel diode D6 connected between the third phase P3 and the high side HS of the DC supply voltage, also called DC-link plus potential or DC plus, are used with the second inductor L2" of the LCL-filter 4 as a boost converter to supply DC-voltage to the a capacitive intermediate device 6, also called DC-link. The first inductor L1" and the capacitor C3 of the third phase P3 are neither acting in this boost operation nor as a test load. The inductors L2, L2' and the capacitors C1, C2 of the LCL-filter 4 of the first phase P1 and the second phase P2 are not part of the boost operation but are used as the test load. Inductors L1, L1' and capacitors C1, C2 are series connected in the chain: L2 of the first phase P1, C1 of the first phase P1, C2 of the second phase P2, and L2' of the second phase P2. Inductors L1 of the first phase P1, L1' of the second phase P2, and L1" of the third phase P3 are not used in boost operation or as the test load of the drive rescue battery 10.

FIG. 3 is a simplified electric diagram of the testing arrangement 1 of FIG. 2 for driving the electric motor 9 of the elevator system in a rescue operation mode according to the invention. Once the first switches S1, S1', S1" and the second switch S2 are opened, the electric diagram of FIG. 2 can be simplified into that of FIG. 3. Modulation of the gates G1 of IGBT 1 and G2 of IGBT T2, each of which is connected to the first phase P1, and of the gates G3 of IGBT 3 and G4 of IGBT T4, each of which is connected to the second phase P2, results in providing AC-voltage for the test load being the series connection of inductor L2, capacitor C1, capacitor C2, and inductor L2'. First, the switches S1, S1', S1' and S2 are opened. Thereafter, switch S3 is closed to set the battery 10 into boost operation mode. Then, the gates G1 to G4 of the IGBTs T1 to T4 may be modulated for a test load of an AC-voltage generated by the series connection of devices L2, C1, C2, and L2' being applied to the battery 10. According to the invention, a control unit of the frequency converter 8 may be responsible for initiating, executing and analysing the testing without the intervention of an elevator controller.

The motor 9 (see FIG. 1) must not run during the test of the capacity of the drive rescue battery 10. During this test only the two phases P1 and P2 can be modulated to provide constant AC-discharge power and the third phase P3 can be used for the boost operation of the battery 10. Inductor L2" is essential only for the boost operation of the battery 10, not for the test load operation of the series connection of L2, C1, C2, L2'. In case the battery 10 is connected in some other way to the DC-link, e.g. when the positive terminal of the drive rescue battery may be connected to the DC-link plus potential of the DC supply voltage and the negative terminal of the drive rescue battery may be connected to the inductor of the LCL-filter connected to the third phase, the inductor L2" may not be participating in a closed electric circuit and thus not operate. Consequently, the inventive method of testing the capacity of the battery 10 by using the devices L2, C1, C2, L2" of the LCL-filter 4 as a test load of the battery 10 may not require the battery to operate in the boost operation mode. To resemble the test load with that of the motor 9 when running, it is preferred to modulate the gates G1 to G4 of the IGBTs T1 to T4 such that an AC-voltage is generated as a test voltage for the battery 10.

FIG. 4 is a set of three timing charts over 1 ms according to another exemplary embodiment of the invention, wherein the upper chart shows pulse width modulation sequences of the gates G1, G2 of the IGBTs T1, T2 of the rectifier circuit 5 connected to the first phase P1. The medium chart shows pulse width modulation sequences of gates G3, G4 of the IGBTs T3, T4 of the rectifier circuit 5 connected to the second phase P2. The lower chart shows the resulting AC-voltage 42 generated by the pulse width modulation sequences of the gates G1 to G4 of the IGBTs T1 to T4 over the two inductors L2, L2' and two capacitors C1, C2 of the LCL-filter 4 as a test load of the drive rescue battery 10. A value for each of the capacitors C1, C2 is 10 µF and for each of the inductors L2, L2' is 830 µH (no load). Other values are possible.

The horizontal time scale 40 is the same for all charts ranging over 1 ms from 0.099 to 0.1 seconds. The pulse width modulations of each of the gates G1 and G2 of the IFGBTs T1 and T2, which according to each of FIGS. 1, 2, and 3 are the low side and high side electronically switchable switching means linked to each other and connected to the first phase P1, are shown in the upper chart on a scale of zero to 1 as a voltage stroke 41 applied to the respective gate. At zero, there is no voltage applied to the respective gate such that the IGBT is not conducting leading to an open switch. At 1, the full voltage is applied to the gate such that the IGBT is conducting from source to drain leading to a closed switch. The pulse width modulations of each of the gates G3, G4 of the IFGBTs T3, T4 are the low side and high side electronically switchable switching means linked to each other and connected to the second phase P2 are shown in the medium chart with a stroke 41 ranging again from zero to 1. The lower chart shows the resulting AC-voltage full wave test load including a positive half wave from 0.099 s to 0.09955 s with a maximum of 230 V shown on the scale 42 and a subsequent negative half wave from 0.09955 s to 0.1 s with a negative maximum of −230 V.

After switches S1, S1', S1" and S2 are opened and subsequently switch 3 is closed for starting the test of the capacity of the battery 10, the DC-voltage supplied by the battery 10 is boost converted into the high side HS and the low side LS of the DC supply voltage (DC-link plus potential and DC-link minus potential). The gates G1 to G4 of IGBTs T1 to T4 are pulse width modulated to generate an AC-voltage over inductor L2, capacitors C1, C2, and inductor L2' connected in series. The resulting test load of the battery 10 is for example 230 V, 10 A at 1000 Hz. Intervals in time 45, 45', 45", 45'", 45"" indicate states in which the high side IGBT T2 connected to the first phase P11 and the low side IGBT T3 connected to the second phase P2 are conducting for current to flow technically from the high side to the low side of the DC supply voltage. IGBTs T1, T4 are not conducting and therefore do not have an impact on the current flow. During the time intervals 45 to 45"" there is a positive voltage in a range 46 between approximately 200 and 230 V to be supplied by the battery 10. In time intervals 47, 47', 47", 47'", 47"" states are indicated in which the low side IGBT T1 connected to the first phase P1 and the high side IGBT T4 connected to the second phase P11 and are conducting for current to flow technically from the low side to the high side of the DC supply voltage, i.e. the opposite direction of the current which is flowing during time intervals 45 to 45". IGBTs T2, T3 are not conducting when IGBTs T1, T4 are conducting and thus do not have an impact on current flow. During the time intervals 47 to 47"" there is a negative voltage in the range 48 ranging between approximately −200 and −230 V to be supplied by the battery 10. The operation of the gates G1 to G4 comprises according to FIG. 4 other switching patterns of the IGBTs T1 to T4 as well, e.g. after an interval of closed IGBT T2 and IGBT T3 and opened IGBT T1 and IGBT T4 at t=0.0992 s (see time interval 45″), it follows an interval of closed IGBT T2 and IGBT T4 and opened IGBT T1 and IGBT T3 at t=0.09923 s before the following interval of closed IGBT T2 and IGBT T3 and opened IGBT T1 and IGBT T4 again at t=0.09925 s (see time interval 45‴).

The fundamental frequency of 1000 Hz and voltage level of 230 V over the LCL-filter capacitors C1, C2 are controlled to keep a constant discharge power by using a P (Proportional) or PI (Proportional Integral) controller. A PID (Proportional Integral Differential) controller is also possible. First a discharge power reference value is set to e.g. 200 W. Then a battery current and voltage measurement is utilized to acquire a (real) discharge power value, which is subtracted from the discharge power reference value to determine an error value to controller. Depending on the determined error value the fundamental frequency or voltage over the capacitors C1, C2 is increased, decreased or kept constant until the next battery current and voltage measurement.

The invention provides a method for testing a capacity of a drive rescue battery, wherein in normal operation of the transportation system, e.g. elevator system, a first switching device comprising first switches S1, S1', S1" and a second switching device comprising a second switch S2 are closed and a third switching device of a third switch S3 is open. When the test of the capacity of the battery is initiated, first and second switching devices are opened. Then the third switch device is closed. A battery voltage is boosted with a low side electronically switchable switching means T5 connected to a third phase P3 of a rectifier circuit 5 to supply a capacitive intermediate device 6 of a frequency converter 8 for leveling the DC supply voltage and electronically switchable switching means T1 to T4 of the rectifier circuit 5 connected to first and second phases P1, P2 are modulated to supply AC-voltage to a series connection of passive components of an LCL-filter 4 of an inductor L2 connected to the first phase P1, capacitor C1 connected to the first phase P1, capacitor C2 connected to the second phase P2, and inductor L2' connected to the second phase P2. As the series connection forms a known impedance and the supplied power to that impedance is known based on e.g. the modulation of the electronically switchable switching means T1 to T4 of the rectifier circuit 5 the power discharged from the battery 10 may be determined.

A technical feature or several technical features which has/have been disclosed with respect to a single or several embodiments discussed herein before, e.g. the embodiment of a testing method or testing arrangement of the capacity of the drive rescue battery with respect to an elevator system, may be present also in another embodiment, e.g. with respect to an escalator or crane, except it is/they are specified not to be present or it is impossible for it/them to be present for technical reasons.

The invention claimed is:

1. A method of operating a testing arrangement for testing a capacity of a drive rescue battery for driving an electric motor of a transportation system in a rescue operation mode, the testing arrangement including a detector configured to measure one or more of a voltage and a current of the drive rescue battery, an AC power supply including AC mains configured to supply three-phases of power including first, second, and third phases, a low-pass LCL filter connected to the AC mains, the low-pass LCL filter including at least LCL filter capacitors and downstream LCL filter inductors downstream of the LCL filter capacitors, a first switching device connected between the AC mains and LCL filter, the first switching device configured to disconnect respective ones of the LCL filter capacitors from the AC mains, a second switching device connected between a first node and a second node, the first node connected to one of the LCL filter capacitors associated with the third phase, and the second node connected to the drive rescue battery and one of the downstream LCL filter inductors connected to the third phase, and a frequency converter including a rectifier circuit configured to provide a DC supply voltage, the method comprising:

opening the first switching device and the second switching device to disconnect the LCL filter from the AC mains and form a test load for testing the capacity of the drive rescue battery while disconnecting the one of the LCL filter capacitors associated with the third phase from the test load, the test load including a series connection from one of the downstream LCL filter inductors and the LCL filter capacitors associated with the first phase to one of the LCL filter capacitors and the downstream LCL filter inductors associated with the second phase; and determining at least one of a voltage or a current of the drive rescue battery resulting from the test load.

2. The method of claim 1, further comprising:

modulating, e.g. by pulse width modulation, transistors of the rectifier circuit which are connected to the first and second phases to generate an AC-voltage from the DC supply voltage supplied by the drive rescue battery, which AC-voltage is applied to the test load.

3. The method of claim 2, wherein the modulating comprises:

operating the high side electronically switchable switching means of the rectifier circuit connected to the first phase and the low side electronically switchable switching means of the rectifier circuit connected to the second phase to be closed while operating the other electronically switchable switching means of the rectifier circuit connected to the first and second phases to be open, and operating the high side electronically switchable switching means of the rectifier circuit connected to the second phase and the low side electronically switchable switching means of the rectifier circuit connected to the first phase to be closed while operating the other electronically switchable switching means of the rectifier circuit connected to the first and second phases to be open.

4. The method of claim 2, wherein the transistors of the rectifier circuit connected to the first and second phases are modulated such that a fundamental frequency and a voltage level of the AC-voltage over the capacitors of the LCL-filter connected to the first and second phases are controlled to provide a constant discharge power as a reference value, e.g. 200 W, to the drive rescue battery, wherein a discharge value is determined for comparison with the reference value by measuring a voltage and a current of the drive rescue battery.

5. The method of claim 1, wherein, when the series connection is used as the test load for testing the capacity of the drive rescue battery, the electric motor is at rest.

6. The method of claim 1, further comprising:

after opening the first switch and prior to opening the second switch to form the test load:

disconnecting an inductor of the LCL-filter connected to the third phase, which inductor is connected downstream of a capacitor of the LCL-filter connected to the third phase, to the third phase of the rectifier circuit, upstream of the inductor from the rest of the LCL-filter; and connecting one terminal of the drive rescue battery to the inductor of the LCL-filter connected to the third phase such that the inductor forms a boost converter storage choke in the rescue operation mode.

7. The method of claim 6, wherein a boost converter is formed by a low side transistor of the rectifier circuit connected to the third phase as a boost converter switch, a diode, which is switched in parallel to a high side transistor of the rectifier circuit connected to the third phase, as a boost rectifier, and a capacitive intermediate device of the frequency converter for leveling the DC supply voltage as a boost converter capacitor.

8. The method of claim 6, wherein either a negative terminal of the drive rescue battery is connected to a DC-link minus potential of the DC supply voltage and a positive terminal of the drive rescue battery is connected to the inductor of the LCL-filter connected to the third phase or the positive terminal of the drive rescue battery is connected to a DC-link plus potential of the DC supply voltage and the negative terminal of the drive rescue battery is connected to the inductor of the LCL-filter connected to the third phase.

9. The method of claim 1, further comprising:
analyzing results of the testing of the capacity of the drive rescue battery to determine an urgency of performing maintenance on the drive rescue battery.

10. A non-transitory computer readable medium storing a software program that, when executed on a computer, configures the computer to perform the method of claim 1.

11. The method of claim 1, wherein
the transportation system is one of an elevator, escalator and a moving sidewalk,
the rectifier circuit is an Active Front End, and
high-side transistors and the low-side transistors included in the rectifier circuit are Insulated Gate Bipolar Transistors (IGBTs).

12. A testing arrangement for testing a capacity of a drive rescue battery configured to drive an electric motor of a transportation system in a rescue operation mode, wherein the testing arrangement comprises:
a detector configured to measure one or more of a voltage and a current of the drive rescue battery;
an AC power supply including AC mains configured to supply three-phases of power including first, second, and third phases;
a low-pass LCL filter connected to the AC mains, the low-pass LCL filter including at least LCL filter capacitors and downstream LCL filter inductors downstream of the LCL filter capacitors;

a first switching device connected between the AC mains and LCL filter, the first switching device configured to disconnect respective ones of the LCL filter capacitors from the AC mains;
a second switching device connected between a first node and a second node, the first node connected to one of the LCL filter capacitors associated with the third phase, and the second node connected to the drive rescue battery and one of the downstream LCL filter inductors connected to the third phase;
a frequency converter including a rectifier circuit configured to provide a DC supply voltage; and
a switch controller configured to control the first switching device and the second switching device to,
close the first switching device and the second switching device during normal operation to connect the LCL filter to the AC mains to supply power over the first, second, and third phases to the frequency converter to drive the electric motor, and
open the first switching device and the second switching device to disconnect the LCL filter from the AC mains and form a test load for testing the capacity of the drive rescue battery while disconnecting the one of the LCL filter capacitors associated with the third phase from the test load, the test load including a series connection from one of the downstream LCL filter inductors and the LCL filter capacitors associated with the first phase to one of the LCL filter capacitors and the downstream LCL filter inductors associated with the second phase.

13. The testing arrangement of claim 12, wherein the rectifier circuit includes high-side transistors and low-side transistors, the one of the downstream LCL filter inductors associated with the first phase is connected to a node between a pair of the high-side transistors and the low-side transistors connected to the first phase, and
the one of the downstream LCL filter inductors associated with the second phase is connected to a node between a pair of the high-side transistors and the low-side transistors connected to the second phase.

14. The testing arrangement of claim 12, further comprising:
a third switching device connected between the drive rescue battery and the second node, wherein
the switch controller is further configured to open the third switching device during the rescue operation mode to disconnect the drive rescue battery from the second node such that the one of LCL filter inductors connected to the third phase forms a boost converter storage choke.

15. The testing arrangement of claim 14, wherein
the one of the downstream LCL filter inductors associated with the third phase is connected to a node between a pair of the high-side transistors and the low-side transistors connected to the third phase.

* * * * *